DIFFUSED JUNCTION SEMICONDUCTOR DEVICE AND METHOD OF MAKING

Filed Nov. 17, 1958

INVENTORS
Robert E. Anderson and
William A. Little
BY Stevens, Davis, Miller & Mosher
ATTORNEYS 3,041,213

DIFFUSED JUNCTION SEMICONDUCTOR DEVICE AND METHOD OF MAKING

Robert E. Anderson, Kingsville, and William A. Little, Richardson, Tex., assignors to Texas Instruments Incorporated, Dallas, Tex., a corporation of Delaware
Filed Nov. 17, 1958, Ser. No. 774,303
7 Claims. (Cl. 148—1.5)

Figure 1:
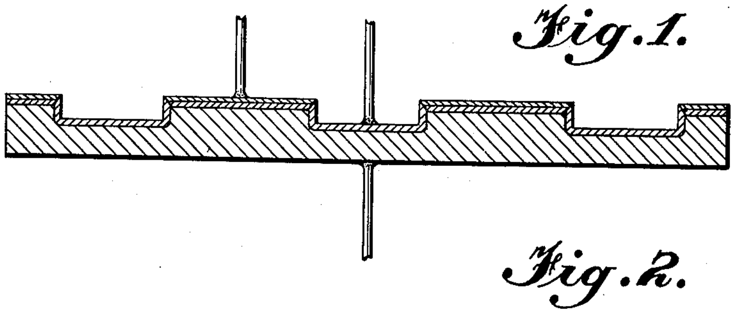

The present invention relates to an improved diffused junction semiconductor device, and more particularly, to an improved diffused junction structure adapted to be utilized as a transistor and to the method for the production thereof.

One of the principal problems involved in the manufacture of transistor devices is making connection to the base region of the device. Heretofore, transistor structures were normally in bar shape with the collector and emitter regions being at opposite ends of the bar with a narrow base region located between them. The bars were obtained from a single crystal of semiconductor material produced in apparatus for crystal growing. The operation of the crystal growing apparatus included techniques, such as double doping, grown diffused, or rate grown which converted the crystal alternatively to different conductivity types. Thus, for example, the initial crystal growth could be of N-type conductivity, and thereafter a contiguous portion of the crystal could be grown having a P-type conductivity. By growing crystals in this fashion, PN junctions or barriers could be produced several times in a single crystal. The crystal could then be cut to form a disc and thereafter diced to produce bars containing plural PN junctions which could then be processed to form transistor devices.

More recent techniques in manufacturing transistor devices make use of single resistivity crystal material and produce transistor devices therefrom using alloy or diffusion techniques. In the production of a transistor using diffusion techniques, a single crystal of semiconductor material is grown having uniform resistivity. The crystal is then sawed and diced to produce wafers having dimensions, for example, of from about 15 to 20 mils in thickness and approximately 300 mils square. The wafers are then subjected to a diffusion process, such as vapor diffusion, whereby impurity atoms are diffused into the surfaces of the wafer in the solid state, with the source of atoms being in the gaseous phase. The depth of penetration of impurity atoms and the concentration gradient in the wafer is dependent upon temperature, time and the diffusion coefficient for the particular system. These factors have been extensively investigated and can easily be determined by reference to recognized literature and patent publications.

The diffusion technique can be carried out such that distinct and different conductivity regions separated by PN junctions can be established in the wafer. Assuming for purposes of illustration that the original crystal is of N-type conductivity, P-type and N-type impurity atoms can be diffused from the gaseous state into the surface of a solid semiconductor wafer to create a surface region of N-type conductivity and an intermediate region of P-type conductivity. The thickness of the diffused N and P type regions is quite narrow. For example, the P-type region may extend into the surface of the wafer approximately 0.35 mil and the surface N-type region may extend into the wafer a distance of 0.15 mil. The resulting article, however, is a transistor since it is characterized by two regions of one type conductivity separated by a narrow region of opposite type conductivity. In this case an N-P-N transistor is formed. It will be appreciated, however, that the opposite type transistor can be produced in the same fashion by selecting opposite impurity materials. Thus, a P-N-P transistor can be produced.

The difficulty of attaching base connections to a diffused junction transistor of the type described above is significant. A further difficulty is encountered in making a large area contact to the base layer in order to improve the power handling capacity of the final unit.

It is an object of the present invention to provide a novel and unique method of making a connection to the base region of a diffused junction transistor which renders this operation much simpler to perform.

A further object of the present invention is to provide a method of making large area connections to the base region of a transistor.

A further object of the present invention is to produce a novel diffused junction transistor made in accordance with the principles of the present invention.

Other and further objects of the present invention will become more readily apparent from the following detailed description of preferred embodiments of the present invention when taken with the appended drawings, wherein:

FIG. 1 is a vertical sectional view of a transistor made in accordance with the present invention; and FIGS. 2–6 are similar views illustrating the steps in the process of making the transistor of FIG. 1.

There will now be described in precise and exact terms a preferred embodiment of the present invention; namely, the method of making an improved diffused junction transistor characterized by a large area base contact improving its power handling capacity and also the article resulting from the practice of the method which itself is characterized by novel features.

Figure 2:
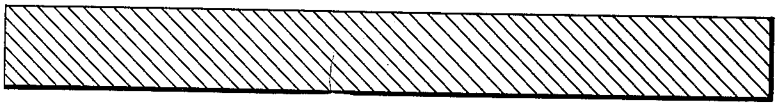

Referring now to the drawings, there is shown in FIG. 2 a wafer of semiconductor material of N-type conductivity. The wafer is obtained from a single crystal of semiconductive material, for instance of germanium, silicon, or semiconductor alloys which was grown in the conventional manner. It is preferred that the crystal be not rotated during growth. It is also preferred that the crystal grown have a resistivity of from four to eight ohm-centimeters. Following growth, the crystal, which will be considered to be silicon by way of example, is sawed and then diced to form wafers approximately 15 mils. thick and about 300 mils square.

Figure 3:
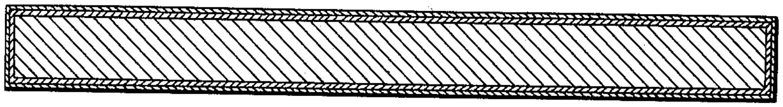

The wafer illustrated in FIG. 2 is then introduced into a quartz tube together with a small quantity of N and P-type impurity, such as aluminum and antimony. The tube is then evacuated, sealed and placed into a furnace where it is baked at a temperature of 1200° C. for about 1 to 3 hours. As a result of this operation, the aluminum and antimony atoms will diffuse into the surface of the wafer on all sides thereof and form a P-layer about 0.5 to 1 mil deep, and an outer N-layer about 0.2 to 0.3 mil thick as shown in FIG. 3. The concentration of impurity atoms in the wafer is so controlled that the concentration of the aluminum is about 5 times $10^{16}$ and the concentration of antimony atoms is about $10^{19}$ to $10^{20}$ per cubic centimeter.

Figure 4:
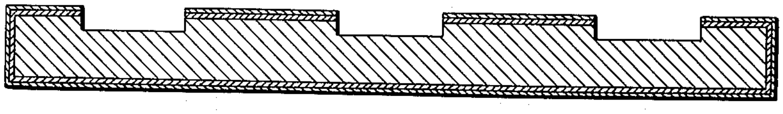

Grooves are then cut into the one face of the wafer as shown in FIG. 4. The grooves are approximately 5 mils deep and approximately 40 mils wide, and are spaced approximately 60 mils apart across the wafer. These grooves can be conveniently cut with a cavitron although any other suitable means may be employed for this purpose. Thereafter, the wafer is treated to oxidize its surface all over. This step is accomplished by placing the wafer in an open quartz tube in a furnace at a temperature of from 1200 to 1250° C. for from 2 to 3 hours and passing wet oxygen through the tube at the rate of about 2 liters per minute during the bake. The wafer is then removed from the furnace and the surface area exclusive of the slots is masked with a material such as wax which is impervious to etching fluids. The unprotected surfaces of the wafer (the slots) are then etched with hydrofluoric acid to remove the oxide layer.

Figure 5:
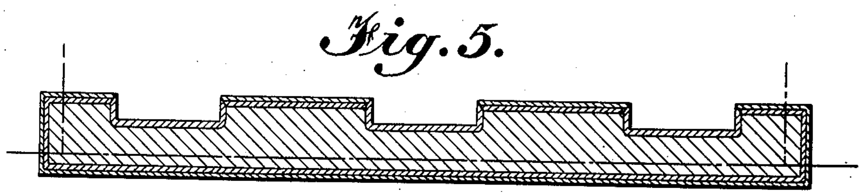
Figure 6:
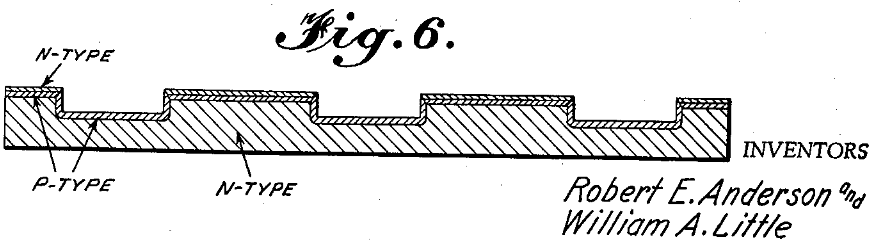

The wafer, together with a quantity of boric acid, is then placed in an open quartz tube and returned to the furnace and heated to a temperature of about 1000° C. The temperature is maintained at 1000° C. for a period of about two hours. During this time, no further appreciable diffusion of the impurities already in the wafer takes place because of the lowered temperature, but the boron atoms from the boric acid are carried over the wafer by an oxygen gas flow established in the tube and diffused into the areas of the grooves in the wafer not protected by the oxide layer formed on the wafer. The result of this technique is to convert the surfaces of the grooves or slots to P-type conductivity material, as is shown in FIG. 5.

After the wafer has been removed from the quartz tube and cooled, it is treated with hydrofluoric acid to remove the oxide layer. The crystal is lapped and cut away as indicated by the dash lines in FIG. 5 to form the unit shown in FIG. 6. The main body of the unit is the collector, the surface diffused region being the emitter and the intermediate diffused region being the base. The diffused areas about the grooves connect to the base region. Attachment of electrical contacts to these regions can now be readily made, especially regarding the base. Attachment of a contact or lead to the emitter layer is preferably made using tin, antimony, or a tin-antimony alloy. A similar connection is preferably made to the collector region of the transistor. The base region of the transistor is readily available and accessible through the P-type material of each slot, and contact may be accomplished by alloying a suitable wire, such as aluminum or indium, to each of the slots or grooves.

By way of a second example of the invention, an N-type non-rotated single resistivity silicon crystal of 4–8 ohm-centimeters was grown. The crystal was cut up into wafers of suitable thickness and area. The wafers were sealed in a quartz tube with indium and arsenic. The tube was evacuated, sealed and baked at a temperature of over 1100° C., preferably at approximately 1200° C. When the impurities had diffused into the wafers, the wafers were removed, cooled and slots were cut with a cavitron extending through the diffused regions. A second bake at 1000° C. was made with a small amount of boron to form diffused regions surrounding the slots as described above. Connections were then made to the various portions of the wafer constituting the collector, base and emitter regions.

The grooves cut into the face of the wafers may be one or more holes, slots or grooves extending across one face of the wafers, one or more circular concentric grooves or any other desired configuration.

It will be obvious to those skilled in the art that various changes may be made without departing from the spirit of the invention and therefore the invention is not limited to what is shown in the drawings and described in the specification, but only as indicated in the appended claims.

What is claimed is:

1. A method of making a diffused junction transistor comprising the steps of diffusing N-type and P-type impurities into one face of a wafer of semiconductor material of one conductivity-type to form a thin outer layer of said one conductivity-type and a thin inner layer of the opposite conductivity-type, cutting a groove into said one face which extends through said thin layers, and diffusing an excess of impurities of said opposite conductivity-type into the surface of said groove to convert to said opposite conductivity-type a surface region of the groove including exposed portions of said wafer and said inner and outer layers, said surface region providing an extension of said inner layer of the same conductivity-type.

2. A method of making a diffused junction transistor comprising the steps of diffusing N-type and P-type impurities into one face of a wafer of semiconductor material of one conductivity-type to form a thin outer layer of said one conductivity-type and a thin inner layer of the opposite conductivity-type, cutting a groove into said one face of said wafer which extends through said thin layers, masking said groove, oxidizing the unmasked areas of said wafer by passing water vapor over the wafer at an elevated temperature, removing the masking from said groove, diffusing an impurity of said opposite conductivity-type into the surface of said groove to convert a region adjacent the surface of the groove to said opposite conductivity-type, said region including exposed portions of said wafer and said inner and outer layers and providing an extension of said inner layer of the same conductivity-type, and removing the oxidized coating from the surfaces of said wafer whereby contacts may be applied thereto.

3. A diffused junction transistor comprising a wafer of one conductivity-type, a first thin layer of said one conductivity-type formed on one face of said wafer, a second thin layer of the opposite conductivity-type formed between said first thin layer and the main body of said wafer, a groove defined in said one face of said wafer extending through said first and second thin layers, a diffused region of the opposite conductivity-type formed in the exposed surface portions of said first and second thin layers and said wafer adjacent the surface of said groove, said region being contiguous to said second thin layer and providing an extension thereof whereby conductive contact may be made thereto.

4. A transistor is defined in claim 3 wherein leads are attached to said first thin layer, to said region within said groove, and to the main body of said wafer.

5. A method of making a diffused junction transistor comprising the steps of diffusing N- and P-type impurities into at least one face of a wafer of semiconductor material of one-type conductivity to form a thin outer layer of said one-type conductivity and a thin inner layer of opposite-type conductivity, cutting a groove into said face which extends through said thin layers, and diffusing an impurity of said opposite type of conductivity into the exposed portions of said wafer and said outer and inner layers adjacent the surface of said groove to provide an extended portion of said inner layer for making conductive contact thereto.

6. A method of making a diffused junction transistor comprising the steps of diffusing N- and P-type impurities into a wafer of semiconductor material of one-type conductivity to form a thin outer layer of said one-type conductivity and a thin inner layer of opposite-type conductivity, removing said thin outer layer and said thin inner layer from one face of said wafer, cutting a groove into an opposite face of said wafer which extends through said thin layers, oxidizing the surface of said wafer, removing the oxide from the surface of said groove, diffusing an impurity of said opposite-conductivity-producing type into the exposed portions of said wafer and said outer and inner layers adjacent the surfaces of said groove to provide an extended portion of said inner layer for making conductive contact thereto, and removing the oxidized layer from the surfaces of said wafer.

7. In the manufacture of a semiconductor device, a method of making an ohmic connection to an intermediate layer of semiconductor material of one conductivity-type which is interposed between first and second layers of semiconductor material of the opposite conductivity-type comprising the steps of forming a groove extending through said first and intermediate layers and into said second layer, diffusing an impurity of said one conductivity-type into the exposed surface portions of said first and second layers and said intermediate layer adjacent the surface of said groove to provide an extended portion of said one conductivity-type which is contiguous to said intermediate layer, and attaching a conductive lead to said extended portion within said groove whereby ohmic contact to said intermediate layer is provided.

References Cited in the file of this patent

UNITED STATES PATENTS

| | | |
|---|---|---|
| 2,672,528 | Shockley | Mar. 6, 1954 |
| 2,814,853 | Paskell | Dec. 3, 1957 |
| 2,861,018 | Fuller | Nov. 18, 1958 |